United States Patent [19]

Bobeck et al.

[11] 4,085,453

[45] Apr. 18, 1978

[54] MAGNETORESISTIVE DETECTOR FOR MAGNETIC BUBBLE MEMORY

[75] Inventors: Andrew Henry Bobeck, Chatham; Peter Istvan Bonyhard, Edison; Terence John Nelson, New Providence, all of N.J.

[73] Assignee: Bell Telephone Laboratories, Incorporated, Murray Hill, N.J.

[21] Appl. No.: 739,472

[22] Filed: Nov. 8, 1976

[51] Int. Cl.² .............................................. G11C 19/08
[52] U.S. Cl. ............................................ 365/8; 365/15
[58] Field of Search ................................. 340/174 TF

[56] References Cited

U.S. PATENT DOCUMENTS

| 4,007,447 | 2/1977 | Bobeck | 340/174 TF |
| 4,019,177 | 4/1977 | Nelson | 340/174 TF |

FOREIGN PATENT DOCUMENTS

| 2,504,758 | 8/1976 | Germany | 340/174 TF |

*Primary Examiner*—James W. Moffitt
*Attorney, Agent, or Firm*—Herbert M. Shapiro

[57] ABSTRACT

A magnetic bubble memory includes an expansion detector having a detector stage with elements having modified chevron-shaped, or "F"-shaped, geometries. The new element geometry avoids unwanted magnetic poles which characterize prior art elements of the detector stage when interlinked into a single magnetoresistive element.

7 Claims, 9 Drawing Figures

MAGNETORESISTIVE DETECTOR FOR MAGNETIC BUBBLE MEMORY

FIELD OF THE INVENTION

This invention relates to magnetic single-wall memories.

BACKGROUND OF THE INVENTION

Magnetic single-wall memories such as magnetic bubble memories are well known in the art. A familiar form of such memories employs a layer of material in which bubbles can be moved and a pattern of magnetic elements, typically of permalloy, which defines propagation channels in the layer. The propagation elements respond to a magnetic field reorienting in the plane of the layer to move bubbles along the channels to a detector arrangement typically also made of permalloy. A bubble memory of this form is commonly referred to as a "field access" bubble memory.

The detector arrangement comprises a succession of stages of a channel where each stage has a number of elements closely spaced apart and aligned transverse to the direction of bubble movement. The numbers of elements in sucessive ones of the stages increase in the direction of bubble movement to a maximum at a detector stage. The elements in the detector stage are linked together to form a single magnetoresistive element astride the bubble path for detecting a bubble which is laterally elongated due to the increasing numbers of elements in the stages preceding and including the detector stage. The elements of the detector arrangement are normally of V-shaped geometry, the plurality of elements in each stage generating a moving wave of attractive poles for elongating as well as for moving a bubble.

The forward motion of a bubble in the detector arrangement is known to be non-uniform. That is to say, movement of an elongated bubble during one phase of a rotating field cycle is faster than in another phase. Consequently, as frequency of operation increases for a material of a given mobility, a maximum speed is reached more quickly than would be reached if a more uniform speed could be achieved.

In addition, the interlinked elements of the detector stage introduce patterns of strong and weak poles for some orientations of the rotating drive fields. These poles, on occasion, cause the elongated bubbles to assume irregular shapes thus leading to reduced margin ranges. For presently available materials, device failures due to problems of this sort manifest themselves at frequencies approaching four hundred kilohertz and at temperatures of about 0° and below.

BRIEF DESCRIPTION OF THE INVENTION

The present invention is directed at a detector arrangement including a modified V-shaped element for a bubble detection stage. The element provides for relatively uniform pole movement and allows for the use of like-placed, interlinking elements in positions which affect bubble propagation only negligibly. In one specific embodiment, inclined F-shaped elements are linked at the bifurcated ends which are in the trailing position with respect to the direction of bubble movement.

DETAILED DESCRIPTION

Figure 1:
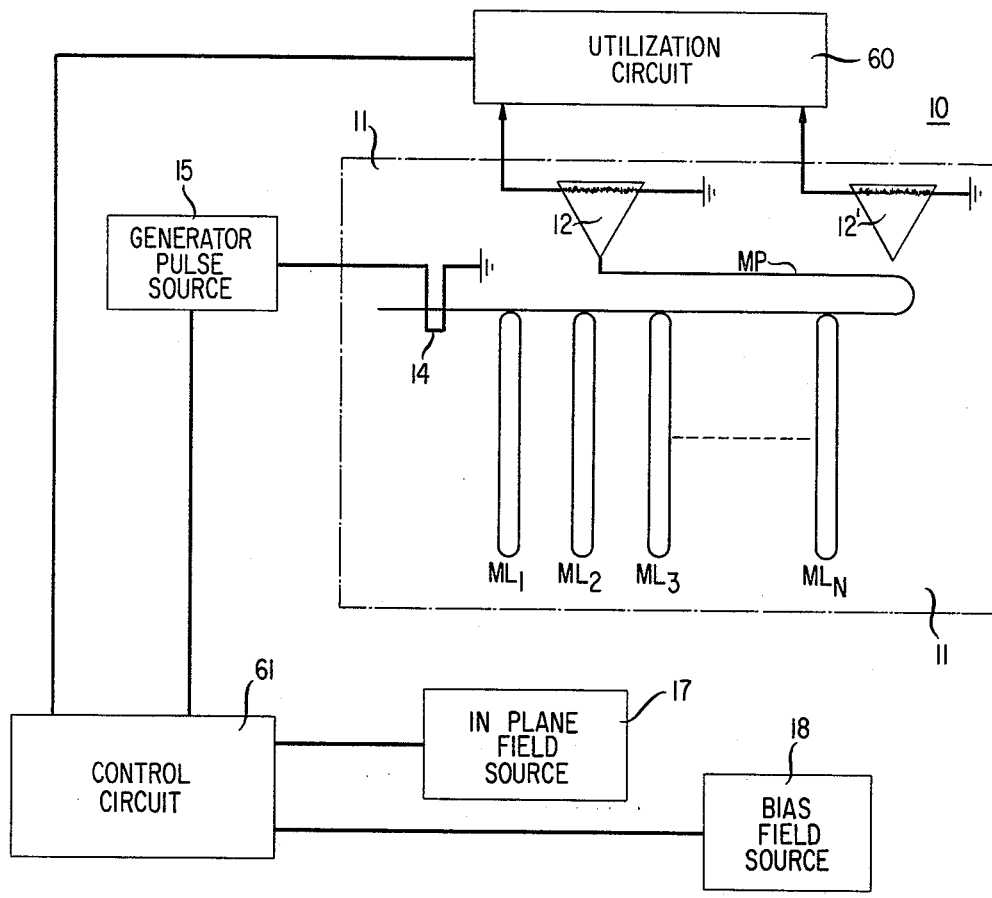
FIG. 1 is a schematic representation of a magnetic bubble memory including an expansion detector arrangement in accordance with this invention.

FIG. 1 shows a magnetic bubble memory 10 including a layer 11 of a material in which magnetic bubbles can be moved. A pattern of elements, typically of permalloy, is arranged in a well understood manner to define minor loops $ML_1$, $ML_2$, $ML_3$ . . . $ML_N$ about which bubbles are recirculated during a propagation operation. The elements also define a major path MP along which bubbles move synchronously to an expansion detector arrangement 12. An electrical conductor 14, defining a bubble generator, is coupled to layer 11 at an end of path MP opposite to that at which the expansion detector arrangement is coupled. Conductor 14 is shown connected between a generator pulse source 15 and ground.

Movement of bubbles in the various loops and paths takes place in response to a magnetic field rotating in the plane of bubble movement as is well known. A source of such a field is represented by block 17 in FIG. 1. A source of a bias field for maintaining a bubble in layer 11 at a selected operating diameter is represented by block 18.

The expansion detector arrangement includes a plurality of stages each normally traversed by a binary bit (viz: bubble--no bubble) during one cycle of the in-plane field. Each stage includes a plurality of magnetic elements as can be seen from FIG. 2. Broken lines 20 and 21 indicate a triangular envelope of elements typically encountered by a bubble moving towards a detector stage 23 from the left in such an arrangement. The advancement of the bubble and the magnetic pole configuration generated by the elements in response to the rotating in-plane field are well understood and not discussed further herein. But the elements of the detector stage respond differently herein due to their unique shape and mode of interlinking.

Figure 3D:
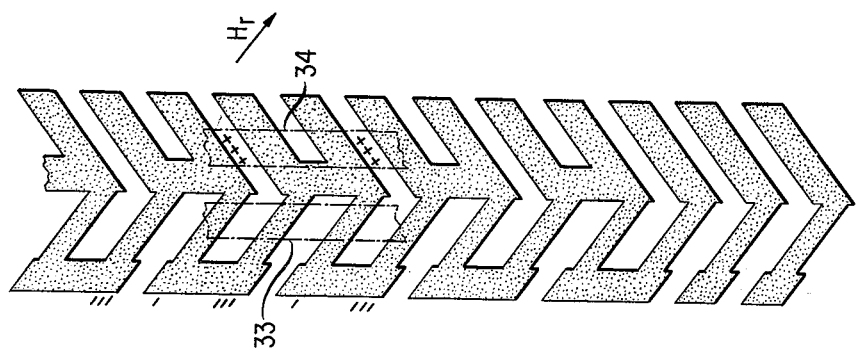
FIGS. 3A, 3B, 3C, 3D, and FIGS. 4A, 4B and 4C are top views of portions of detector stages of a prior art expansion detector arrangement and the expansion detector arrangement of FIG. 2, respectively.
Figure 3C:
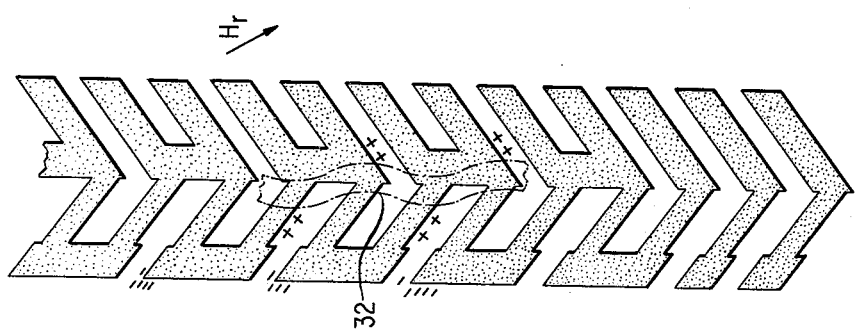
Figure 3B:
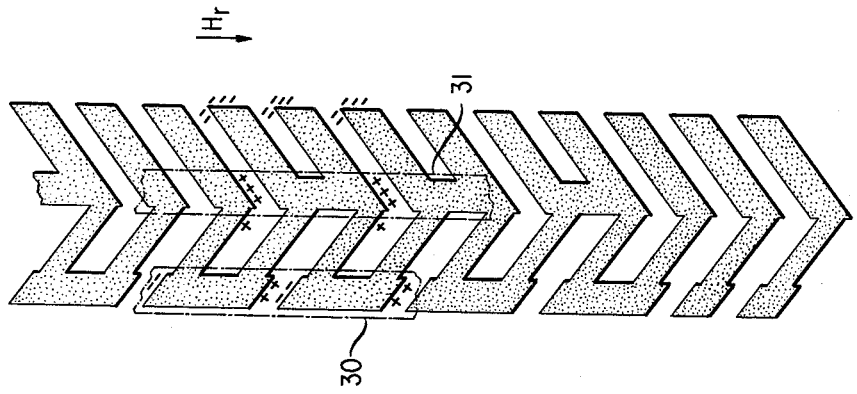
Figure 3A:
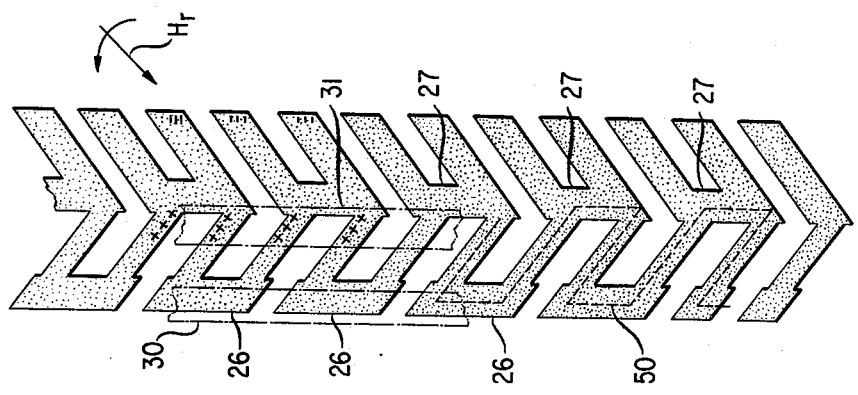

FIGS. 3A, 3B, 3C and 3D show a prior art bubble detector stage with chevron-shaped elements interlinked at the first encountered edge of the elements and at the apices as shown in FIG. 3A by the elements designated 26 and 27, respectively. A bubble moving from left to right as viewed in FIG. 3A is elongated as represented by strip 30. As in the in-plane (rotating) field $H_r$ rotates counterclockwise to a position shown in FIG. 3A, the bubble ideally moves to the position shown for strip 31. Pole patterns which are attractive to domains are represented as + signs; the repelling poles are represented as minus signs. Under, for example, high bias field conditions, a bubble represented by the strip may fail to move to the position of strip 31 because the + poles may be too far away to attract a strip (at 30). Thus, high bias failures sometimes occur. As the in-plane field continues to reorient to move strip 31 (normally) further to the right as represented in FIG. 3B, the strip 30 actually may not have moved at all.

The in-plane field $H_r$ next reorients to the right. Attracting poles accumulate along the interlinking elements as well as along the chevron elements as indicated by the + signs in FIG. 3C. Since the + signs are displaced from one another along the path of bubble movement as well as transverse to that path, the elongated bubble takes on an undulating shape represented as strip 32 in FIG. 3C. If the bubble had previously moved to the position of strip 31 in FIG. 3B, portions of the strip actually move backwards during this phase of an in-plane field cycle.

When the field next reorients as shown by arrow $H_r$ in FIG. 3D, the bubble is either left behind (out of synchronization with the field) as shown by strip 33, or in an acceptable position shown occupied by strip 34.

Figure 4C:
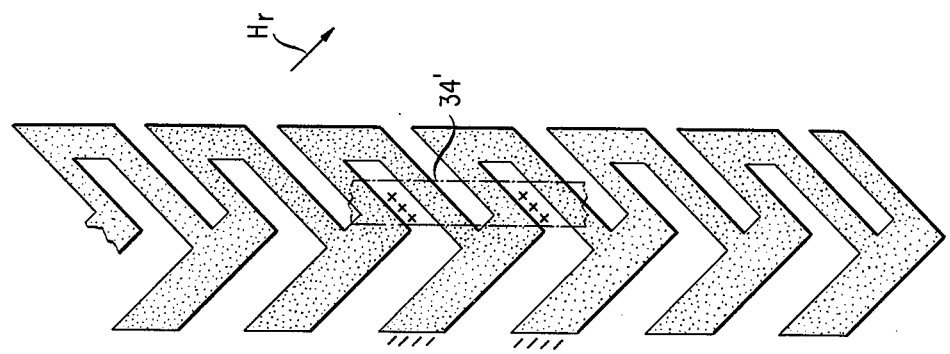
Figure 4B:
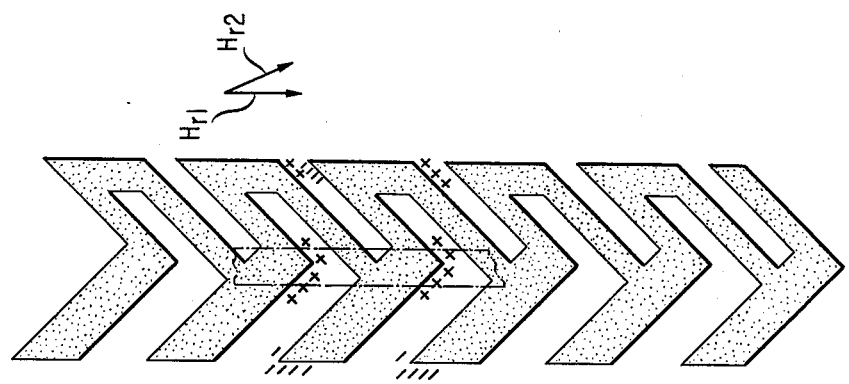
Figure 4A:
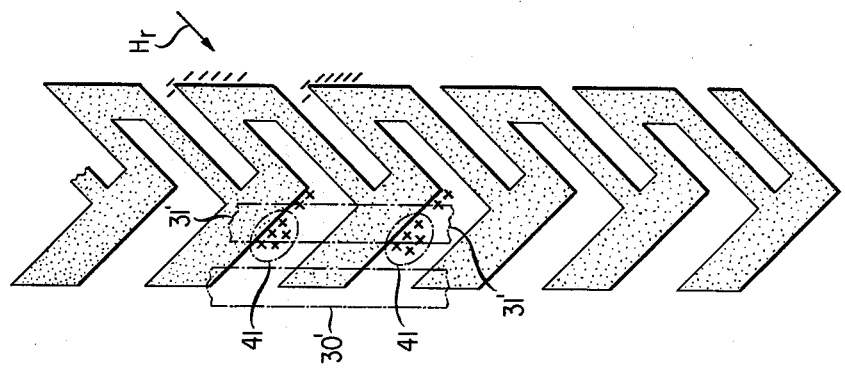

FIGS. 4A, 4B and 4C demonstrate the preferred pole patterns as produced by elements in accordance with this invention. Again, the in-plane field is in an orientation previously shown for it in FIG. 3A. The inclined F-shaped element provides attractive pole accumulations much closer to the position of strip 30' as indicated at 41 in the figure. Therefore, movement to the position of strip 31' is assured. Further, as the in-plane field rotates first into its position of arrows $H_{r1}$ in FIG. 4B and then into the position of arrow $H_{r2}$, the attractive poles "roll" around the apices of the elements as indicated by the + signs in the FIG. 4B. As the field rotates to the position of arrow $H_r$ in FIG. 4C, the bubble finds itself in the position of strip 34' shown in FIG. 4C.

The relatively smooth generation and movement of attractive poles in FIGS. 4A, 4B and 4C is due first to the bifurcated end of an element which comes into alignment with the in-plane field in FIG. 4A. Because of the existence of two relatively narrow but parallel legs, two sets of attractive pole accumulations occur. One of those sets for each element is desirably close to the previous strip position for realizing smooth and precise forward motion. These two sets of poles tend to merge and then to be dominated by poles at the ends of the relatively wide side of the element for the sequence of field orientations shown in FIG. 4B. The relatively wide geometry of the nonbifurcated leg of each element also allows a desirable spread of poles shown in FIG. 4C. The geometry clearly leads to precise and smooth pole progression and thus to smooth bubble (strip) movement.

As was clear from the description in connection with FIGS. 3A–3D, the ambiguous movement of bubbles through a detector arrangement was due to the presence of the elements which linked the elements of a detector stage in series to form a magnetoresisitive element. The ambiguous movement led to a degradation of an output signal indicative of the presence of a bubble. The problem, accordingly, was a detection problem due to the ambiguous movement of a bubble in the detector stage and thus to an inaccuracy in the phase synchronization of an output signal. The more precise movement of a bubble in a detector stage having elements in accordance with this invention results in an extension of the operating margins in this regard.

Figure 2:
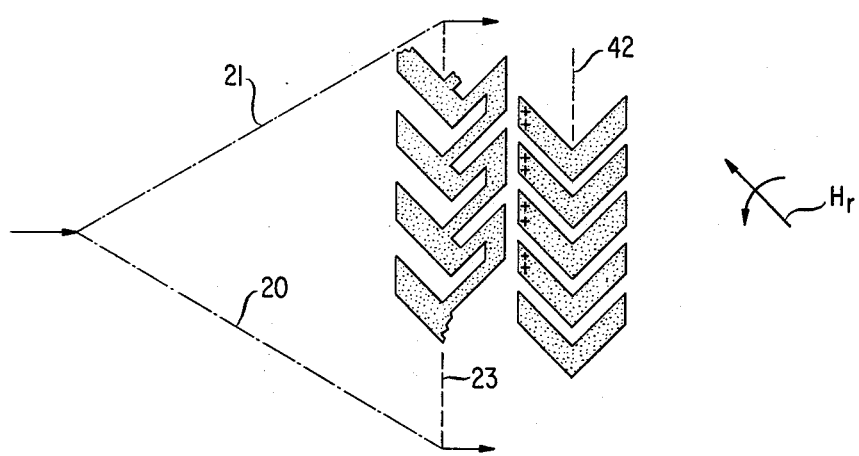
FIG. 2 is an expanded top view of the detector arrangement of FIG. 1 including the detector stage thereof.

A detected bubble advances to a stage 42 subsequent to the detector stage, as shown in FIG. 2, when the in-plane field is in a direction indicated by the arrow $H_r$ in FIG. 2. The poles generated in stage 42 as indicated by the + signs in FIG. 2 are very strong and overcome any deleterious effects due to attractive poles generated in the detector stage due to the interlinking elements at this time. In fact, the positions shown in FIG. 2 for the interlinking elements of stage 23 is the most desirable position, the elements being placed just prior to the position in which the strongest poles are generated in stage 42 at the time of interstage transfer of a strip.

The invention may be thought of in a different light. Specifically a plurality of basically chevron-shaped elements constitute the detector stage. Through these elements a current path, indicated by dotted line 50 in FIG. 3A, is defined to form a magnetoresistive element. Moreover, the current path includes that portion of the chevron-shaped elements coupled by the elongated bubble when detection is to occur. In order to establish such a path, adjacent elements are linked as by linking elements 26 and 27 for the detection of a strip domain. In order to eliminate unwanted poles generated by the interlinking elements, the entire area between the like sides of alternate pairs of chevron-shaped elements can be thought of as filled with permalloy to form the basic shape of an element in accordance with this invention. The width of each subportion of the bifurcated side of an element typically is one-half of the nonbifurcated side and the amount of permalloy in the two sides are above equal (assuming uniform permalloy thickness). The resulting relative widths and orientations for the sides of the elements produce the desired pole configurations described above and allow for the placement of all the linking elements in the like positions shown. The orientation of the bifurcated sides of the elements in the downstream position ensures that if the linking elements produce unwanted poles, those poles are produced only when the elongated bubble is being attracted to a next consecutive stage by relatively very strong poles.

The signals developed by a magnetoresistive element of a detector stage herein are applied to utilization circuit 60 of FIG. 1 in a manner now well understood in the art in response to interrogate signals applied thereto synchronously with the in-plane drive field under the control of a control circuit 61. Circuit 60 and sources 15, 17 and 18 are all operative under the control of control circuit 61 of FIG. 1 for such activation and synchronization. The various sources and circuits are any such elements capable of operating in accordance with this invention.

Typically, the output signals are compared to those of a second (dummy) detector formed on the same chip with the first detector of FIG. 2 (and also applied to utilization circuit 60). Alternatively, the second detector may be an active detector energized, for example, during alternative cycles of the in-plane field from that during which the first detector is activated. The second detector, in these cases, is formed also with F-shaped elements to provide cancellation of all components of the output signal due to the in-plane field except those also due to the detected bubble. The second detector is indicated in FIG. 1 at $12^1$.

The foregoing description is considered to be merely illustrative of the principles of this invention. Accordingly, various modifications thereof can be devised by those skilled in the art in accordance with those principles within the spirit and scope of the invention as encompassed by the following claims.

What is claimed is:

1. A magnetic bubble memory including a layer of material in which magnetic bubbles can be moved and means for defining in said layer a path for the movement of bubbles to an expansion detector including a detector stage, said stage including a plurality of magnetic propagate elements aligned along an axis transverse to said path, adjacent pairs of said elements being linked by interlinking magnetic elements to form a series arrangement defining a bubble detector, each of said magnetic propagate elements including first and second contiguous side portions arranged at an angle to one another, each of said second side portions being bifurcated for defining first and second relatively narrow subportions, said second subportion of each one of said second side portions being coupled to the first subportion of the next consecutive one of said elements by one of said interlinking elements.

2. A memory in accordance with claim 1 wherein said propagate and interlinking elements comprise permalloy and said bifurcated side portions and interlinking elements are arranged further along said path than the nonbifurcated portions.

3. A magnetic bubble memory including a layer of material in which magnetic bubbles can be moved and means for defining in said layer a path for the movement of bubbles to an expansion detector including a detector stage said stage including a plurality of permalloy elements aligned transverse to said path, each of said elements comprising first and second side portions arranged at an angle to one another, the number of first sides in said detector stage being equal to one-half the number of second sides, a pair of said second sides being contiguous with one of said first sides along a center line of said stage in a manner to form inclined-F-shaped elements, one of said second sides of each of said elements being linked by a permalloy element to the adjacent second side of the next adjacent of said elements to form a series arrangement defining a magnetoresistive detector.

4. A magnetic bubble memory in accordance with claim 3 wherein the amount of permalloy in the total number of first sides equals that in the number of second sides.

5. A magnetic bubble memory in accordance with claim 4 wherein the width of a first side of each of said elements in twice the width of each of the second sides.

6. A magnetic bubble memory in accordance with claim 5 wherein said pairs of second sides of said elements are arranged in the downstream direction of said path from said first sides.

7. A magnetic bubble memory in accordance with claim 6 wherein said memory also includes a second detector also comprising interlinked inclined F-shaped elements.

* * * * *